(12) United States Patent
Yamada et al.

(10) Patent No.: US 9,261,567 B2
(45) Date of Patent: Feb. 16, 2016

(54) METHOD FOR DETERMINING A POWER LEVEL OF A BATTERY AND CIRCUIT THEREFOR

(71) Applicant: Semiconductor Components Industries, LLC, Phoenix, AZ (US)

(72) Inventors: Susumu Yamada, Ora-gun (JP); Hideo Kondo, Ora-gun (JP); Seiji Takai, Hirakata (JP)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 233 days.

(21) Appl. No.: 14/194,815

(22) Filed: Mar. 2, 2014

(65) Prior Publication Data

US 2014/0176146 A1 Jun. 26, 2014

Related U.S. Application Data

(63) Continuation of application No. 13/226,050, filed on Sep. 6, 2011, now Pat. No. 8,664,919.

(30) Foreign Application Priority Data

Sep. 6, 2010 (JP) .................................. 2010-199181

(51) Int. Cl.
*H01M 10/44* (2006.01)
*H01M 10/46* (2006.01)
*G01R 31/36* (2006.01)

(52) U.S. Cl.
CPC ........ *G01R 31/3644* (2013.01); *G01R 31/3651* (2013.01)

(58) Field of Classification Search
CPC ............................. H02J 7/0026; H02J 7/0021
USPC ...................... 320/107, 132, 149; 429/90, 91; 340/635, 636.1, 636.12, 636.13, 340/363.15
See application file for complete search history.

(56) References Cited

U.S. PATENT DOCUMENTS

| 8,527,784 B2* | 9/2013 | Nakashima ................... 713/300 |
| 2005/0237027 A1 | 10/2005 | Sasaki et al. |
| 2007/0114971 A1 | 5/2007 | Uesaka et al. |

(Continued)

FOREIGN PATENT DOCUMENTS

| JP | 2005-345172 A | 12/2005 |
| JP | 2007-240523 A | 9/2007 |

OTHER PUBLICATIONS

English translation and Patent Abstract for Japanese Application No. 2005-345172 Published Dec. 15, 2005 (7 pages).

(Continued)

*Primary Examiner* — Edward Tso
(74) *Attorney, Agent, or Firm* — Rennie William Dover

(57) ABSTRACT

A remaining battery power calculation circuit includes: a detection unit configured to detect an output voltage of a battery; a data storage unit configured to store data in an associated manner with each of a plurality of current values for charge or discharge of the battery, the data indicating a relationship between the output voltage and a ratio of remaining power of the battery to a capacity of the battery in a case where the battery is charged or discharged with each of the plurality of current values; and a first calculation unit configured to calculate a charging/discharging current of the battery based on the data and the output voltage.

20 Claims, 5 Drawing Sheets

(56) References Cited

U.S. PATENT DOCUMENTS

2008/0255783 A1 10/2008 Tamai
2012/0056596 A1* 3/2012 Yamada et al. .............. 320/134

OTHER PUBLICATIONS

English translation and Patent Abstract for Japanese Application No. 2007-240523 Published Sep. 20, 2007 (12 pages).

* cited by examiner

100a

OUTPUT VOLTAGE Vb (mV) OF REMAINING-POWER RATE FROM 0 TO 9% (T = 20°C)

| CURRENT VALUE (mA) | 0 | 1 | 2 | 3 | 4 | 5 | 6 | 7 | 8 | 9 |
|---|---|---|---|---|---|---|---|---|---|---|
| 2000 | 3672 | 3734 | 3818 | 3875 | 3911 | 3920 | 3927 | 3938 | 3944 | 3945 |
| 1000 | 3449 | 3541 | 3660 | 3725 | 3776 | 3811 | 3822 | 3823 | 3824 | 3829 |
| 500 | 3244 | 3379 | 3530 | 3610 | 3676 | 3722 | 3745 | 3750 | 3760 | 3762 |
| 0 | 3121 | 3321 | 3458 | 3548 | 3594 | 3641 | 3660 | 3668 | 3673 | 3676 |
| -500 | 2998 | 3262 | 3385 | 3486 | 3511 | 3559 | 3568 | 3586 | 3595 | 3597 |
| -1500 | 2997 | 3248 | 3355 | 3409 | 3439 | 3457 | 3472 | 3489 | 3496 | 3502 |
| -3000 | 2995 | 3072 | 3118 | 3162 | 3196 | 3212 | 3236 | 3245 | 3262 | 3266 |

REMAINING-POWER RATE (%)

OUTPUT VOLTAGE Vb (mV) OF REMAINING-POWER RATE FROM 10 TO 100% (T = 20°C)

| CURRENT VALUE (mA) | 10 | 20 | 30 | 40 | 50 | 60 | 70 | 80 | 90 | 100 |
|---|---|---|---|---|---|---|---|---|---|---|
| 2000 | 3960 | 4017 | 4057 | 4084 | 4116 | 4137 | 4194 | 4248 | 4400 | 4550 |
| 1000 | 3839 | 3895 | 3928 | 3953 | 3986 | 4024 | 4067 | 4133 | 4290 | 4446 |
| 500 | 3766 | 3820 | 3857 | 3876 | 3899 | 3944 | 3997 | 4056 | 4132 | 4310 |
| 0 | 3688 | 3739 | 3772 | 3794 | 3819 | 3859 | 3920 | 3979 | 4053 | 4143 |
| -500 | 3610 | 3657 | 3687 | 3711 | 3739 | 3773 | 3842 | 3901 | 3973 | 4093 |
| -1500 | 3514 | 3542 | 3567 | 3598 | 3630 | 3675 | 3724 | 3785 | 3851 | 3983 |
| -3000 | 3280 | 3343 | 3375 | 3410 | 3450 | 3476 | 3517 | 3580 | 3643 | 3792 |

REMAINING-POWER RATE (%)

FIG. 5

METHOD FOR DETERMINING A POWER LEVEL OF A BATTERY AND CIRCUIT THEREFOR

The present application is a continuation application of U.S. patent application Ser. No. 13/226,050 filed on Sep. 6, 2011, by Susumu Yamada et al., titled "Remaining Battery Power Calculation Circuit" which is hereby incorporated by reference in its entirety, and priority thereto for common subject matter is hereby claimed.

BACKGROUND OF THE INVENTION

1. Field of the Invention

The present invention relates to a remaining battery power calculation circuit.

2. Description of the Related Art

In portable electronic equipment such as a cellular phone, a digital camera and the like, generally, remaining power of a battery, which is used as a power source, is calculated and the remaining battery power is displayed. Methods of calculating the remaining battery power include a method of calculating the remaining battery power by detecting an output voltage of a battery and a method of calculating a remaining battery power by detecting a charging/discharging current of a battery, for example (See Japanese Patent Laid-Open Publication No. 2005-345172 and Japanese Patent Laid-Open Publication No. 2007-240523, for example).

In the method of calculating the remaining battery power based on an output voltage of a battery, a microcomputer or the like which detects an output voltage of a battery, for example, uniquely calculates the remaining battery power from the output voltage of the battery. However, the output voltage of the battery varies with a load current of a load connected to the battery, a change in internal resistance of the battery and the like. Thus, with the method of calculating the remaining battery power only from the output voltage of the battery, it is difficult to calculate the remaining battery power with accuracy. On the other hand, with the method of detecting remaining battery power based on a charging/discharging current of the battery, a microcomputer or the like, which detects a charging/discharging current of the battery, calculates remaining battery power by integrating the charging/discharging current, for example, and thus the remaining battery power can be calculated with accuracy. However, in order to detect the charging/discharging current, a resistor or the like, which detects the charging/discharging current, needs to be connected to the battery in series, which deteriorate efficiency as a power source. Further, since an AD (Analog to Digital) converter, a microcomputer or the like, which detects a charging/discharging current, needs to be provided in a battery pack, which leads to a problem that the battery pack becomes expensive.

SUMMARY OF THE INVENTION

A remaining battery power calculation circuit according to an aspect of the present invention, includes: a detection unit configured to detect an output voltage of a battery; a data storage unit configured to store data in an associated manner with each of a plurality of current values for charge or discharge of the battery, the data indicating a relationship between the output voltage and a ratio of remaining power of the battery to a capacity of the battery in a case where the battery is charged or discharged with each of the plurality of current values; and a first calculation unit configured to calculate a charging/discharging current of the battery based on the data and the output voltage.

Other features of the present invention will become apparent from descriptions of this specification and of the accompanying drawings.

BRIEF DESCRIPTION OF THE DRAWINGS

For more thorough understanding of the present invention and advantages thereof, the following description should be read in conjunction with the accompanying drawings, in which:

FIG. 5 is a diagram for describing charging/discharging data 100a stored in a data table 61;

DETAILED DESCRIPTION OF THE INVENTION

At least the following details will become apparent from descriptions of this specification and of the accompanying drawings.

Figure 1:
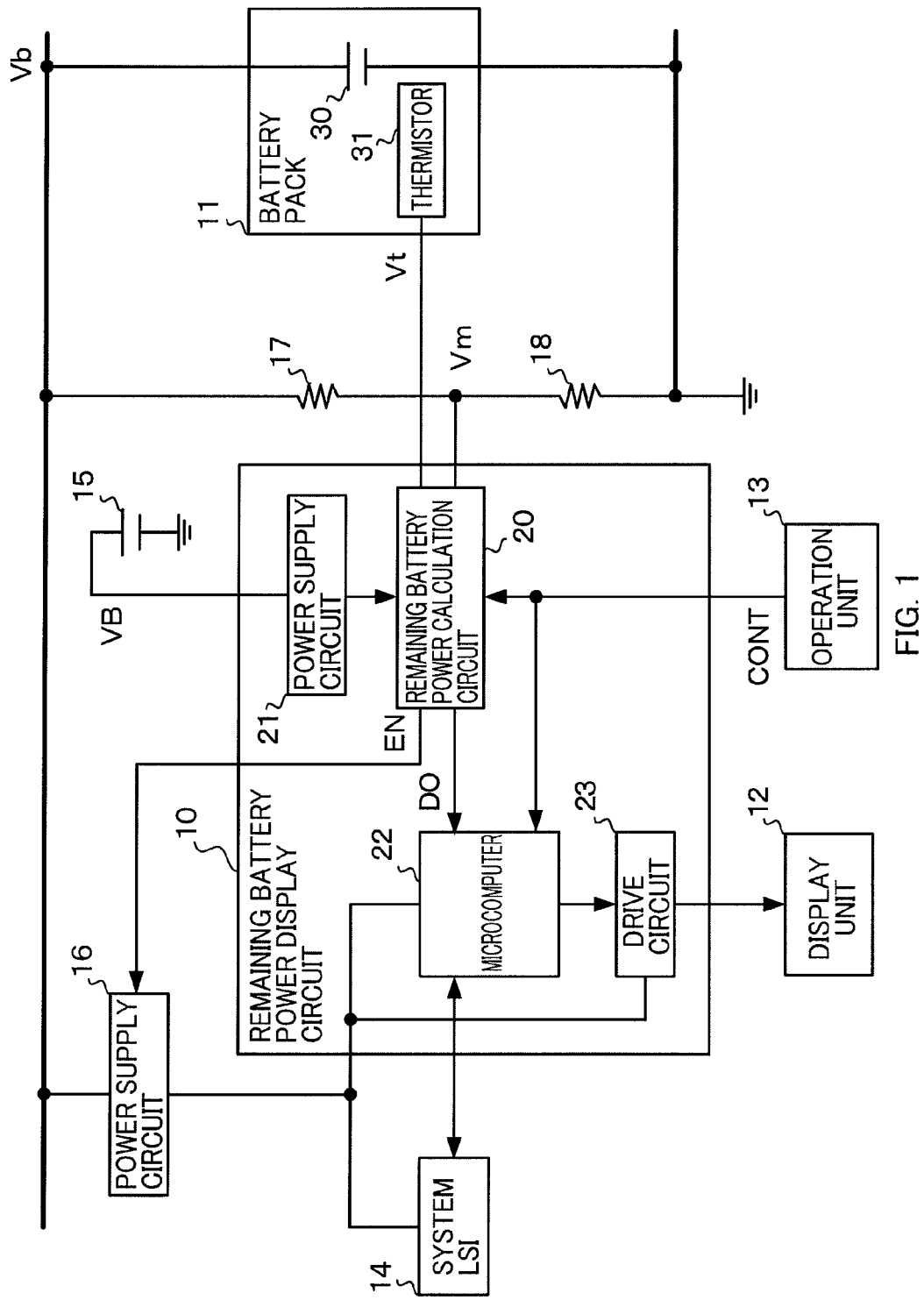
FIG. 1 is a diagram illustrating a configuration of a remaining battery power display circuit 10 according to an embodiment of the present invention.

FIG. 1 is a diagram illustrating a configuration of a remaining battery power display circuit 10 according to an embodiment of the present invention. The remaining battery power display circuit 10 is a circuit which is provided in a cellular phone (not shown), for example, and which is configured to display a remaining power of a battery 30 in a battery pack 11 of the cellular phone on a display unit 12 of the cellular phone. Also, the remaining battery power display circuit 10 includes a remaining battery power calculation circuit 20, a power supply circuit 21, a microcomputer 22, and a drive circuit 23.

The battery pack 11 is a battery pack used as a power supply for the cellular phone to be operated, and includes: a battery 30 such as a chargeable lithium ion battery or the like; and a thermistor 31 configured to generate a voltage Vt which corresponds to a temperature of the battery 30, for example. In an embodiment of the present invention, a voltage generated between a negative-side electrode and a positive-side electrode of the battery 30 is referred to as an output voltage Vb of the battery 30.

The display unit 12 is a display screen such as a liquid crystal panel provided in the cellular phone to display characters, images and the like.

An operation unit 13 includes a keypad of various types, such as a dial key, a power key and the like (not shown), to operate the cellular phone, and outputs control data CONT according to the operation of the keypad, for example. If a user manipulates the power key in the operation unit 13 in order to start the cellular phone, for example, the control data CONT to start the cellular phone is outputted from the operation unit 13.

A system LSI (Large Scale Integration) 14 is a circuit configured to realize various functions such as communication in the cellular phone, for example.

A battery 15 is a primary battery such as a button battery, for example, and is used in order to operate a real-time clock circuit (not shown) or the like to update time of the cellular phone or the like when the cellular phone is turned off.

A power supply circuit 16 is a circuit configured to generate such a power supply voltage capable of operating the system LSI 14 or the like based on the output voltage Vb of the battery 30 when an enable signal EN is inputted from a remaining battery power calculation circuit 20, which will be described later.

The remaining battery power calculation circuit 20 is a microcomputer configured to calculate the remaining power of the battery 30 based on a voltage Vm obtained by dividing the output voltage Vb of the battery 30 by resistors 17 and 18 and a voltage Vt from the thermistor 31, when the control data CONT to start the cellular phone is inputted thereto. Although the details will be described later, the remaining battery power calculation circuit 20 according to an embodiment of the present invention generates the enable signal EN to start the power supply circuit 16 when calculation of the remaining power of the battery 30 is started, and transmit to the microcomputer 22 the calculated remaining power and data DO corresponding to the voltage Vt indicating the temperature of the battery 30 or the like.

The power supply circuit 21 is a circuit configured to generate a power supply voltage to operate the remaining battery power calculation circuit 20, from the battery 15.

The microcomputer 22 is a circuit configured to integrally control the cellular phone based on the control data CONT according to the operation result of the operation unit 13. Further, the microcomputer 22 is configured to transfer data DO outputted from the remaining battery power calculation circuit 20 to a drive circuit 23 configured to drive the display unit 12.

The drive circuit 23 is a circuit configured to drive the display unit 12 so that the remaining power, the temperature and the like of the battery 30, for example, are displayed on the display unit 12 based on the data DO from the microcomputer 22.

Figure 2:
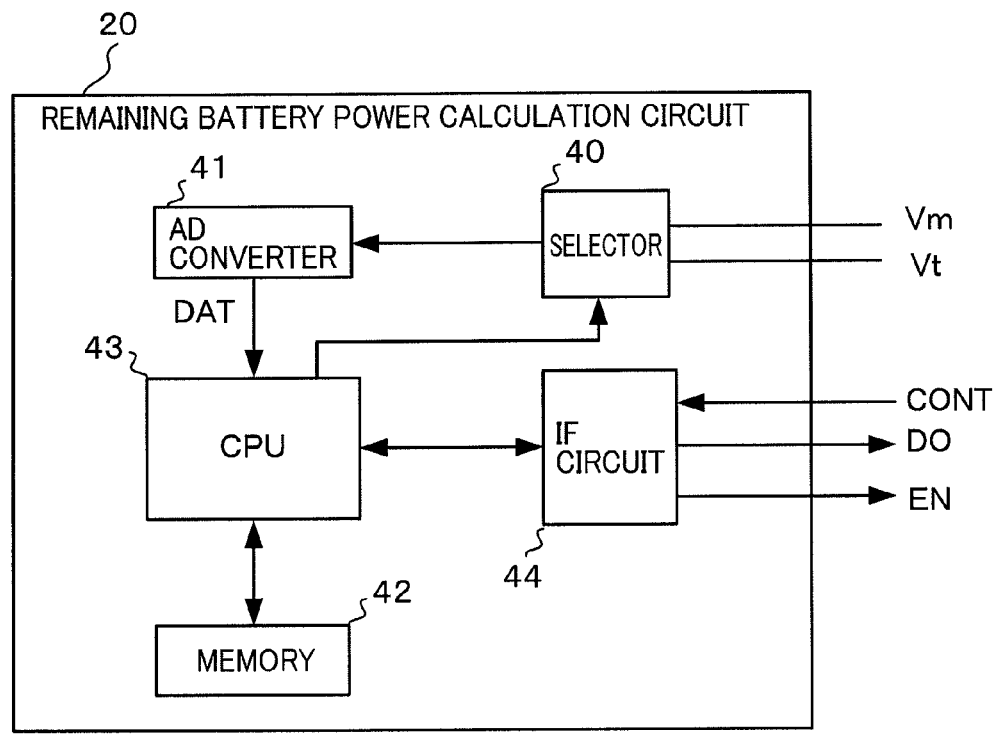
FIG. 2 is a diagram illustrating a configuration of a remaining battery power calculation circuit 20.

FIG. 2 is a diagram illustrating details of the remaining battery power calculation circuit 20. The remaining battery power calculation circuit 20 includes a selector 40, an AD converter 41 (detection unit), a memory 42, a CPU (Central Processing Unit) 43, and an IF (Interface) circuit 44.

The selector 40 is a circuit configured to select the inputted voltage Vm or voltage Vt, to be outputted to the AD converter 41 based on an instruction from the CPU 43, which will be described later.

The AD converter 41 is a circuit configured to convert the analog voltage Vm and voltage Vt outputted from the selector 40 into voltage data DAT in a digital value. The AD converter 41 according to an embodiment of the present invention is realized by a successive-approximation type AD converter, for example.

The memory 42 is a circuit configured to store programs to be executed by the CPU 43 and various types of data.

The CPU 43 is configured to integrally control the entire remaining battery power calculation circuit 20, and realize various functions by executing the programs stored in the memory 42.

The IF circuit 44 is a circuit configured to exchange various data between the CPU 43 and the operation unit 13, the power supply circuit 16, and the microcomputer 22.

Figure 3:
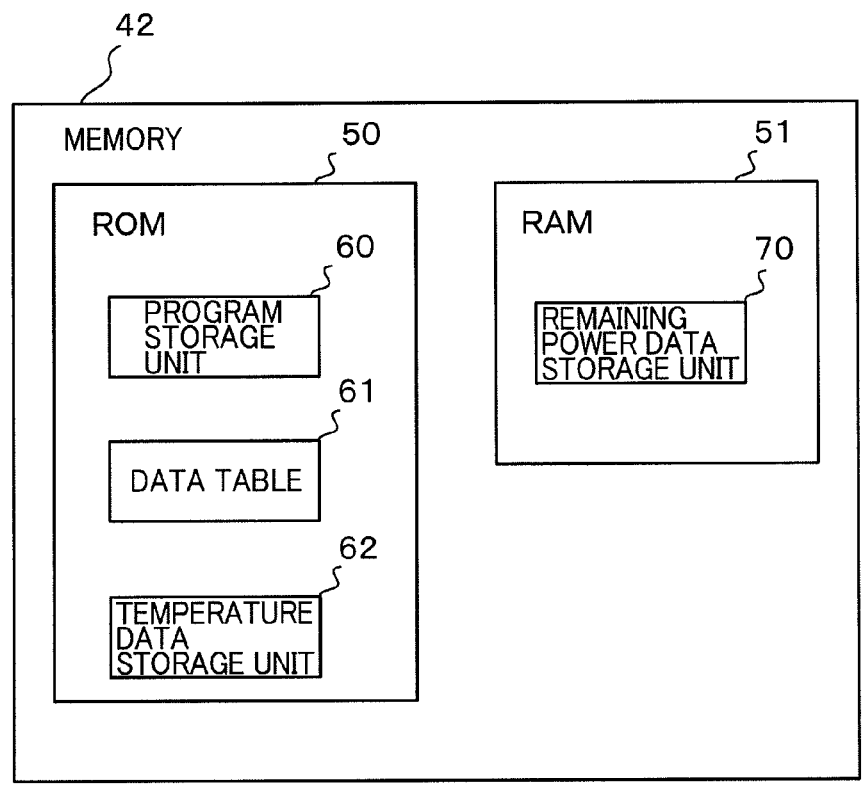
FIG. 3 is a diagram illustrating a configuration of a memory 42.

As illustrated in FIG. 3, the memory 42 includes a ROM (Read only Memory) 50 and a RAM (Random Access Memory) 51.

A storage area of the ROM 50 is provided with a program storage unit 60 configured to store a program to operate the CPU 43, a data table 61 configured to store data which is required for the CPU 43 to calculate the remaining power of the battery 30, and a temperature data storage unit 62 configured to store data indicating the relationship between the voltage Vt and the temperature.

A storage area of the RAM 51 is provided with a remaining power data storage unit 70 (second data storage unit) which is configured to store remaining power data (second data) indicating a ratio of the remaining power of the battery 30 to the capacity of the battery 30 (hereinafter referred to as a remaining power rate).

Figure 4:
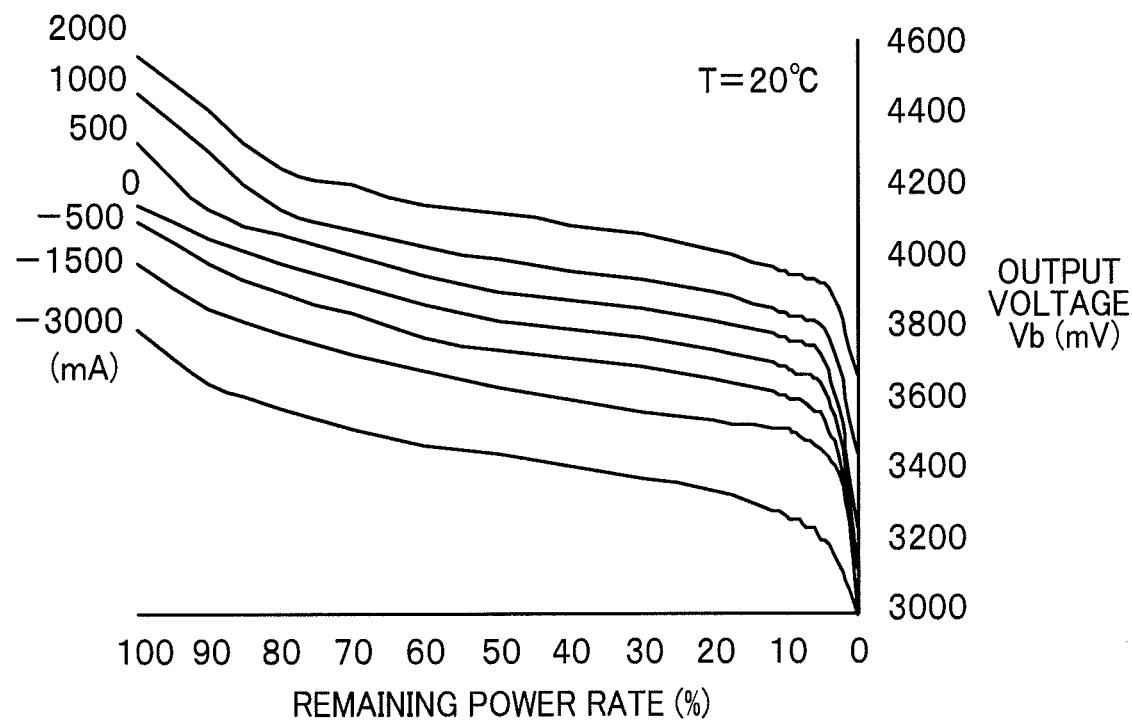
FIG. 4 is a diagram for describing charging/discharging data 100a stored in a data table 61.
Figure 6:
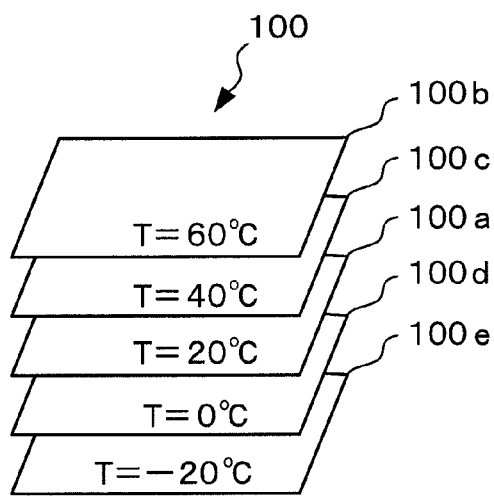
FIG. 6 is a diagram for describing charging/discharging data 100 stored in a data table 61.

The data table 61 (first data storage unit) stores data indicating the relationship between the remaining power rate and the output voltage Vb of the battery 30 when the battery 30 is charged or discharged with currents having different current values, as illustrated in FIG. 4, for example. It is numerical value data (hereinafter referred to as charging/discharging data) of each of the different current values. In an embodiment of the present invention, the above-described charging/discharging data exists for each of the different temperatures, as illustrated in FIG. 6. In an embodiment of the present invention, the charging/discharging data illustrated in FIG. 5 is assumed to be charging/discharging data 100a. Also, the charging/discharging data 100a is assumed to be data at T=20° C. Also, charging/discharging data 100b to 100e (not shown) are assumed to be data at T=60° C., 40° C., 0° C., and −20° C., respectively. In FIGS. 4 and 5, for example, description referred to as 500 corresponds to a charging current of 500 mA, and for example, description referred to as −500 corresponds to a discharging current of 500 mA.

In FIG. 5, for example, the storage areas corresponding to the second row in the upper table, i.e., the storage areas respectively corresponding to the remaining power rates of 0% to 9% with the current of 2000 mA, respectively store the values of the output voltages Vb of the battery 30 with respect to the remaining power rates of 0% to 9% when the battery 30 is charged with the current at 2000 mA. The storage areas corresponding to the second row in the lower table in FIG. 5, i.e., the storage areas respectively corresponding to the remaining power rates of 10% to 100% with the current of 2000 mA, respectively store the values of the output voltages Vb with respect to the remaining power rates of 10% to 100% when the battery 30 is charged with the current at 2000 mA. Similarly, the storage areas respectively corresponding to the third and fourth rows in the upper and lower tables, i.e., the storage areas respectively corresponding to the remaining power rates of 0% to 100% with the currents of 1000 mA and 500 mA, respectively store the values of the output voltages Vb with respect to the remaining power rates when the battery 30 is charged with the currents of 1000 mA and 500 mA. The storage areas corresponding to the sixth to eighth rows in the upper and lower tables, i.e., the storage areas respectively corresponding to the remaining power rates of 0% to 100% with the currents of 500 mA, 1500 mA, and 3000 mA, respectively store the values of the output voltage Vb with respect to the remaining power rates when the battery 30 is discharged with the currents of 500 mA, 1500 mA, and 3000 mA. Further, the storage areas corresponding to the fifth row in the upper table and the lower table, i.e., the storage areas respectively corresponding to the remaining power rates of 0% to 100% with the current of 0 mA, respectively store the values of the output voltages Vb with respect to the remaining power rates at no load, that is, when the current for load of the battery 30 is 0 mA.

In an embodiment of the present invention, it is assumed that the charging/discharging data 100 (first data) including the charging/discharging data 100a to 100e, as described above, is stored in the data table 61, but the charging/discharging data 100 is required to be prepared in advance. As such, FIG. 5 is a data table corresponding to characteristics illustrated in FIG. 4. Here, the characteristic curves in FIG. 4 show characteristics that the output voltage varies with the current in charging/discharging for each of the remaining battery power rates since the internal resistance of the battery varies with the remaining battery power rates.

Figure 7:
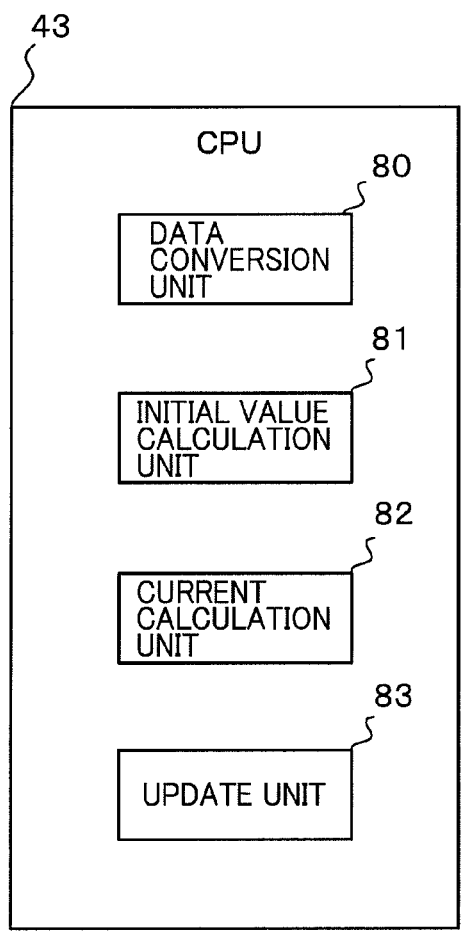
FIG. 7 is a diagram illustrating a configuration of a functional block that is realized by a CPU 43 executing a program.

FIG. 7 is a diagram illustrating a part of a functional block realized by the CPU 43. As illustrated in FIG. 7, the CPU 43 realizes a data conversion unit 80, an initial value calculation unit 81, a current calculation unit 82, and an update unit 83 by executing the program stored in the program storage unit 60. The data conversion unit 80 and the current calculation unit 82 correspond to a first calculation unit, and the data conversion unit 80 and the initial value calculation unit 81 correspond to a second calculation unit.

The data conversion unit 80 is configured to obtain voltage data DAT outputted from the AD converter 41 based on an instruction from the initial value calculation unit 81 or the current calculation unit 82, which will be described later, and calculate the output voltage Vb of the battery 30 and the temperature of the battery 30. Specifically, the data conversion unit 80 is configured to control the selector 40 so as to cause the AD converter 41 to sequentially output the voltage Vm and the voltage Vt based on an instruction from the initial value calculation unit 81 or the current calculation unit 82. Then, the data conversion unit 80 is configured to obtain the voltage data DAT converted by the AD converter 41, and calculate the output voltage Vb and the temperature T of the battery 30 based on a voltage division ratio between the resistors 17 and 18 and the temperature data stored in the temperature data storage unit 62.

The initial value calculation unit 81 is configured to calculate, as remaining power data, the remaining power rate of the battery 30 at a time when the cellular phone is started, if the control data CONT to start the cellular phone is inputted through the IF circuit 44, for example. Specifically, the initial value calculation unit 81 is configured to cause the data conversion unit 80 to calculate the output voltage Vb and the temperature T, and then, calculate the remaining power data referring to the data at no load in the charging/discharging data 100 of the data table 61. Also, the initial value calculation unit 81 is configured to store the calculated remaining power data in the remaining power data storage unit 70 as well as generate the enable signal EN so as to start the power supply circuit 16.

The current calculation unit 82 is configured to calculate a charging/discharging current of the battery 30 in a predetermined period. The current calculation unit 82 is configured to cause the data conversion unit 80 to calculate the output voltage Vb and the temperature T in a predetermined period if the initial value calculation unit 81 stores the remaining power data in the remaining power data storage unit 70, as well as obtain the output voltage Vb and the temperature T. Then, a charging/discharging current I1 of the battery 30 is calculated based on the obtained output voltage Vb and temperature T, the remaining power data in the remaining power data storage unit 70, and the charging/discharging data 100 in the data table 61.

The update unit 83 is configured to calculate the remaining power of the battery 30 based on the remaining power data in the remaining power data storage unit 70, as well as integrate the charging/discharging current I1 calculated in the current calculation unit 82 with the remaining power of the battery 30. Then, when the charging/discharging current I1 is integrated with the remaining power of the battery 30, the update unit 83 calculates the remaining power data indicating the remaining power rate, to be stored in the remaining power data storage unit 70 based on the remaining power of the battery 30 and the capacity of the battery 30. That is, the update unit 83 according to an embodiment of the present invention integrates the charging/discharging current I1 with the remaining power of the battery 30, and updates the remaining power data in accordance with the integration result. Also, the update unit 83 according to an embodiment of the present invention is configured to transmit, as data DO, the remaining power data and the temperature T to the microcomputer 22 when the remaining power data is updated.

<<Operation of Remaining Battery Power Display Circuit 10>>

Here, an operation of the remaining battery power display circuit 10 will be described. First, when a user manipulates the power key (not shown) in the operation unit 13 of a cellular phone so as to start the cellular phone, the operation unit 13 outputs the control data CONT to start the cellular phone.

When the control data CONT to start the cellular phone is inputted to the initial value calculation unit 81 of the CPU 43 through the IF circuit 44, the initial value calculation unit 81 causes the data conversion unit 80 to obtain the voltage Vm and the voltage Vt in order to calculate the remaining power of the battery 30. Thus, the data conversion unit 80 calculates the output voltage Vb and the temperature T of the battery 30. Further, the initial value calculation unit 81 obtains the calculated output voltage Vb and the temperature T. Then, the initial value calculation unit 81 calculates the remaining power data from the obtained output voltage Vb, temperature T and the data at no load in the charging/discharging data 100. And then, the initial value calculation unit 81 stores, as the remaining power data, the calculated remaining power rate in the remaining power data storage unit 70, as well as generates the enable signal EN so as to start the power supply circuit 16. When the power supply circuit 16 is started, the power supply circuit 16 generates a power supply voltage based on the output voltage Vb of the battery 30, and thus, the system LSI 14, the microcomputer 22, and the drive circuit 23 are started. Then, the current calculation unit 82 in the CPU 43 calculates the charging/discharging current I1 every predetermined time when the remaining power data is stored in the remaining power data storage unit 70. After a predetermined time has elapsed (here, with regard to the predetermined time, assuming that the fully charged battery is discharged at a discharging current of 2000 mA for 4 hours, a time corresponding to the discharging time of 0.01% is 4 hours=4×3600 (seconds)× 0.0001=1.44 (seconds), which time is used as a monitoring time), the current calculation unit 82 controls the data conversion unit 80 so as to cause the data conversion unit 80 to obtain the voltage Vm and the voltage Vt. As a result, the data conversion unit 80 calculates the output voltage Vb and the temperature T of the battery 30 based on the voltage Vm and the voltage Vt. Then, the current calculation unit 82 calculates the charging/discharging current I1 using the calculated output voltage Vb, the temperature T, the remaining power data stored in the remaining power data storage unit 70, and the charging discharging data 100. Subsequently, the current calculation unit 82 according to an embodiment of the present invention calculates the charging/discharging current I1 using the output voltage Vb, the temperature t, the remaining power data, and the charging/discharging data 100. When the charging/discharging current I1 is calculated, the update unit 83 integrates the charging/discharging current I1 with the remaining power of the battery 30. Moreover, the update unit 83 calculates the remaining power rate from the remaining power of the battery 30 and the capacity of the battery 30, and updates, as the remaining power data, the remaining power data in the remaining power data storage unit 70. Then, the update unit 83 transmits the remaining power data and the temperature T as the data DO to the microcomputer 22, as described above. Also, since the microcomputer 22 transfers the data DO to the drive circuit 23, the drive circuit 23 drives the display unit 12 based on the data DO. As a result, in the display unit 12 of the cellular phone, the remaining power rate and the temperature of the battery 30 are displayed. Further, in an embodiment of the present invention, since the current calculation unit 82 calculates the charging/discharging current I1 every predetermined time, the processing in the above-described step is repeated until the remaining power rate reaches 0%. Therefore, the display of the display unit 12 is updated every predetermined time.

The data table 61 in the CPU 43 of the remaining battery power calculation circuit 20 according to an embodiment of the present invention configured as described above stores the charging/discharging data 100a indicating the relationship between the remaining power rate and the output voltage Vb of the battery 30 when the battery 30 is charged or discharged with currents of current values different from each other. The remaining data storage unit 70 stores the remaining power data corresponding to the remaining power of the battery 30. The current calculation unit 82 is capable of calculating the charging/discharging current I1 using the charging/discharging data 100a, the output voltage Vb of the battery 30, and the remaining power data, for example. Thus, the charging/discharging current can be calculated without detecting the charging/discharging current of the battery 30, in actuality. Also, in an embodiment of the present invention, the update unit 83 updates the remaining power rate by integrating the calculated charging/discharging current I1 with the remaining power of the battery 30. Thus, the remaining power rate of the battery 30 is updated as needed in an embodiment of the present invention, and a user can check the remaining power rate as appropriate.

In the remaining battery power calculation circuit 20 according to an embodiment of the present invention, the initial value calculation unit 81 calculates the remaining power data based on the data at no load of the charging/discharging data 100 when the control data CONT to start the cellular phone is inputted. Since the operation of the power supply circuit 16 is stopped at this time, the battery 30 is in a no-load state. As such, in an embodiment of the present invention, the remaining power data of the battery 30 is calculated under a predetermined condition. Thus, in an embodiment of the present invention, the initial value of the remaining power data of the battery 30 can be calculated with accuracy.

Further, the current calculation unit 82 according to an embodiment of the present invention calculates the charging/discharging current I1 based on the output voltage Vb and the temperature T. Thus, even if the temperature of the battery 30 changes, the current calculation unit 82 can calculate the remaining power of the battery 30 with accuracy.

Further, the initial value calculation unit 81 according to an embodiment of the present invention calculates the remaining power data when the cellular phone is started based on the output voltage Vb and the temperature T. Thus, even if the temperature changes, the initial value calculation unit 81 can calculate the initial value of the remaining power data with accuracy.

The above embodiments of the present invention are simply for facilitating the understanding of the present invention and are not in any way to be construed as limiting the present invention. The present invention may variously be changed or altered without departing from its spirit and encompass equivalents thereof.

In an embodiment of the present invention, the initial value calculation unit 81 is provided with the CPU 43, but it is not limited thereto. An embodiment of the present invention may be configured, for example, such that another microcomputer or the like (not shown), which is configured to operate when the cellular phone is started, calculates the remaining power data corresponding to the remaining power of the battery 30, to be stored in the remaining power data storage unit 70, similarly to this embodiment of the present invention.

What is claimed is:

1. A battery power determination circuit, comprising:
a central processing unit having an input, an output, a first input/output, and a second input/output;
a selector circuit having a plurality of inputs and an output, a first input of the selector circuit coupled to the output of the central processing unit;
an interface circuit having an input, a plurality of outputs, and an input/output, the input/output of the interface circuit coupled to the first input/output of the central processing unit;
an analog-to-digital converter having an input and an output, the input of the analog-to-digital converter coupled to the output of the selector circuit; and
a first storage element having an input/output coupled the second input/output of the central processing unit.

2. The battery power determination circuit of claim 1, wherein the central processing unit comprises:
a first calculation unit having an input and an output, the input of the first calculation unit serving as the input of the central processing unit; and
a second calculation unit having an input and an output, the input of the second calculation unit coupled to the input of the first calculation unit.

3. The battery power determination circuit of claim 2, wherein the first calculation unit comprises a current calculation unit and a data conversion unit.

4. The battery power determination circuit of claim 2, wherein the second calculation unit comprises an initial value calculation unit and a data conversion unit.

5. The battery power determination circuit of claim 4, wherein the central processing unit further includes an update unit having an input and an output, the output coupled to the first storage element.

6. The battery power determination circuit of claim 5, wherein the first storage element comprises a Read only Memory and a Random Access Memory.

7. The battery power determination circuit of claim 6, wherein the Read Only Memory comprises a first storage unit, a second storage unit, and a third storage unit.

8. A method for determining a power level of a battery, comprising:
providing a first storage element configured to store battery charging/discharging data in an associated manner with each of a plurality of current values for charge or discharge of the battery, the battery charging/discharging data indicating a relationship between the output voltage and a ratio of remaining power of the battery to a capacity of the battery in a case where the battery is charged or discharged with each of the plurality of current values;
determining a first parameter of the battery and a second parameter of the battery in response to a first signal;

determining remaining power data at no load using at least the first parameter;

storing the remaining power data in a second storage element;

determining a charging/discharging current after each predetermined time of a plurality of predetermined times in response to storing the remaining power data in the second storage element;

generating an updated first parameter of the battery and an updated second parameter of the battery after a first predetermined time;

determining a charging/discharging current of the battery in response to the updated first parameter, the updated second parameter, the remaining power data stored in the first storage element, and the battery charging/discharging data;

determining a remaining power of the battery in response to the remaining power data stored in the second storage element; and integrating the remaining power with the charging/discharging current to generate an integration result representing updated remaining power data.

9. The method of claim 8, wherein determining the first parameter of the battery further includes determining a second parameter of the battery, wherein the first parameter is an output voltage of the battery and the second parameter is a temperature of the battery.

10. The method of claim 8, wherein generating the updated first parameter includes generating an updated output voltage of the battery and generating an updated second parameter comprises generating an updated temperature of the battery.

11. The method of claim 10, wherein determining the first parameter of the battery and determining the second parameter of the battery includes sequentially outputting the output voltage of the battery and the temperature of the battery.

12. The method of claim 9, further including transmitting the current power data and a current temperature of the battery to a microcomputer.

13. The method of claim 11, wherein determining the remaining power data includes using the output voltage of the battery and the temperature of the battery.

14. The method of claim 8, wherein storing the remaining power data in a first storage element further includes generating an enable signal configured to start a power supply circuit.

15. A method for determining a power level in a battery, comprising:

providing a first storage element configured to store battery charging/discharging data in an associated manner with each of a plurality of current values for charge or discharge of the battery, the battery charging/discharging data indicating a relationship between the output voltage and a ratio of remaining power of the battery to a capacity of the battery in a case where the battery is charged or discharged with each of the plurality of current values;

determining remaining power data in response to a first output voltage of the battery, a first temperature of the battery, and the battery charging/discharging data, the remaining power data including a remaining power of the battery;

storing the remaining power data and the first temperature in a second storage element;

determining a first charging/discharging current in response to the remaining power data stored in the first storage element; and integrating the first charging/discharging current with the remaining power of the battery.

16. The method of claim 15, further including:

updating the remaining power data in response to a second output voltage of the battery, second temperature of the battery, and the battery charging/discharging data to generate an updated remaining power data and an updated second temperature, the updated remaining power data including an updated remaining power of the battery; and generating a second charging/discharging current in response to the updated remaining power data; and integrating the second charging/discharging current with the updated remaining power of the battery.

17. The method of claim 16, further including determining the remaining power data in response to the battery charging/discharging data at no load and determining a temperature of the battery in response to a first control signal.

18. The method of claim 16, wherein determining remaining power data in response to a charging/discharging current at no load and determining a temperature of the battery includes converting the first output voltage of the battery from an analog signal to a digital first output voltage signal and converting the first temperature of the battery from an analog signal to a digital first temperature signal, and further including sequentially outputting the digital first output voltage of the battery and the digital temperature of the battery to a central processing unit.

19. The method of claim 18, further including transmitting the updated power level of the battery and a current temperature of the battery to the central processing unit.

20. The method of claim 19, wherein determining the remaining power of the battery in response to the updated remaining power data includes using a ratio of the updated remaining power data to a capacity of the battery.

* * * * *